United States Patent
Honma

[19]

[11] Patent Number: 5,981,966
[45] Date of Patent: Nov. 9, 1999

[54] AUTO-TEACHING METHOD IN SEMICONDUCTOR PROCESSING SYSTEM

[75] Inventor: Manabu Honma, Shiroyamamachi, Japan

[73] Assignee: Tokyo Electron Limited, Tokyo, Japan

[21] Appl. No.: 09/022,383

[22] Filed: Feb. 12, 1998

[30] Foreign Application Priority Data

Feb. 20, 1997 [JP] Japan .................................. 9-053827

[51] Int. Cl.⁶ ............................ G01B 11/00; H01L 21/68
[52] U.S. Cl. ............................ 250/559.33; 901/47; 901/3; 414/172
[58] Field of Search ........................... 250/559.33, 559.29; 901/47, 3, 5; 356/400; 414/941, 937, 938, 172

[56] References Cited

U.S. PATENT DOCUMENTS

| | | | |
|---|---|---|---|
| 4,770,590 | 9/1988 | Hugues et al. | 414/172 |
| 4,986,729 | 1/1991 | Ohlenbusch | 414/787 |
| 5,044,752 | 9/1991 | Thurfjell et al. | 356/400 |
| 5,783,834 | 7/1998 | Shatas | 250/559.33 |

FOREIGN PATENT DOCUMENTS

| | | |
|---|---|---|
| 7-74229 | 3/1995 | Japan . |
| 8-222620 | 8/1996 | Japan . |

*Primary Examiner*—Edward P. Westin
*Assistant Examiner*—Thanh X. Luu
*Attorney, Agent, or Firm*—Oblon, Spivak, McClelland, Maier & Neustadt, P.C.

[57] ABSTRACT

A detecting apparatus for performing an auto-teaching operation is used in a vertical heat treatment system to cause a controller for controlling movement of a wafer transfer arm to learn a unit of positional information about a wafer boat placed on a transfer station. The detecting apparatus has a base frame having a shape similar to a wafer and detachably mounted on a wafer holding place of the boat. On the base frame are a Z-sensor formed of an optical sensor of a reflection type, a pair of θ-sensors, and an X-sensor. The auto-teaching operation is performed by observing the transfer arm by the detecting apparatus while the detecting apparatus is placed on the wafer holding place of the boat.

20 Claims, 5 Drawing Sheets

AUTO-TEACHING METHOD IN SEMICONDUCTOR PROCESSING SYSTEM

BACKGROUND OF THE INVENTION

The present invention relates to an auto-teaching technique to cause a controller for controlling movement of a transfer apparatus for a target substrate, such as a semiconductor wafer or an LCD substrate, to learn a unit of information about relative positions between the transfer apparatus itself and a holder for the target object, such as a transfer container, a process rack, or a process worktable. Where the controller has a grasp on the relative positions between the holder and the transfer apparatus in advance, it can accurately control movement of the transfer apparatus during transfer of the target substrate, such as stop positions and driving amounts of a transfer arm, and the like. The semiconductor process includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In a vertical heat treatment system, for example, a number of semiconductor wafers are transferred by a transfer arm (or arms) from a transfer container, which is called a cassette, to a process rack, which is called a wafer boat. Then the wafers are loaded into a vertical furnace along with the wafer boat and are subjected to a heat process. In such an apparatus, it is necessary to perform a teaching operation about relative positions between the transfer arm and the cassette or the wafer boat placed at a predetermined position, after the wafer boat is washed or the transfer arm undergoes a maintenance operation.

There is a teaching method in which the transfer arm is manually controlled by an operator to perform a predetermined transfer operation, and a unit of positional information is stored in a memory on the basis of the movement of the transfer arm during the operation. However, since the wafer boat is frequently washed, it is troublesome and time-consuming to perform the manual teaching operation after the washing operation every time.

For this reason, there has been developed a technique, which is called an auto-teaching method, of automatically performing a teaching operation without relying on an operator. Jpn. Pat. Appln. KOKAI Publication No. 7-74229 discloses an auto-teaching method in which a teaching operation is performed, using a jig including a plate having a shape similar to a semiconductor wafer, and a pin vertically disposed at the center of the plate, and also using a distance-detecting sensor of a reflection type arranged on a transfer apparatus. The jig is placed on a holder, and a side surface of the jig and the pin are detected by the distance-detecting sensor, so that a unit of information about relative positions between the holder and the transfer apparatus is obtained.

This auto-teaching method, however, cannot be applied, as it is, to an existing processing system using a transfer apparatus which has no distance-detecting sensor of a reflection type and thus requires a manual teaching operation by an operator. In order to perform this method in such an existing processing system, it is necessary to provide the transfer apparatus with a distance-detecting sensor of a reflection type, thereby entailing expense, time, and labor for remodeling the processing system. Further, where a new processing system capable of performing this method is constructed, a transfer apparatus to be used therein will inevitably be complicated and expensive.

BRIEF SUMMARY OF THE INVENTION

Therefore, it is an object of the present invention to provide an auto-teaching method which can be applied to an existing processing system without remodeling the system, and can also be applied to a new processing system without increasing its installation cost. It is another object of the present invention to provide a detecting apparatus used for the method and a vertical heat treatment system capable of performing an auto-teaching operation.

According to a first aspect of the present invention, there is provided a detecting apparatus for performing an auto-teaching operation in a semiconductor processing system to cause a controller, for controlling movement of a transfer arm for a target substrate by a driving mechanism in a driving coordinate system, to learn a unit of positional information about a holder, to and from which the target substrate is transferred, in the coordinate system, the detecting apparatus comprising:

a base frame designed to be detachably mounted on the holder;

a first detector attached to the base frame for detecting relative positions between the arm and the holder in a vertical direction, the first detector comprising a sensor of a reflection type for detecting presence of the arm at a position facing the first detector with a certain distance therebetween;

a second detector attached to the base frame for detecting relative positions between the arm and the holder in a horizontal direction;

a transmission member for transmitting signals from the first and second detectors to the controller as electric detection signals;

a signal processor arranged in the controller for deriving a unit of positional information, comprising a position of the holder or a position of the arm representing the position of the holder in the coordinate system, from signals denoting states of the driving mechanism corresponding to positions of the arm in the coordinate system, and detection signals of the first and second detectors; and a memory arranged in the controller for storing the unit of positional information derived by the signal processor.

Preferably, the holder has a holding place for holding the target substrate, and the base frame is designed to be detachably mounted on the holding place.

Preferably, the base frame is provided with a positioning surface extending in a direction intersecting a horizontal direction, for positioning the base frame on the holding place, and the positioning surface is arranged to abut against a stopper surface extending in a direction intersecting a horizontal direction on the holder.

Preferably, the base frame is formed of a flat plate, and the positioning surface is defined by a cut-out formed in the plate.

Preferably, the first detector comprises an optical sensor of a reflection type formed of a light-emitting device and a light-receiving device.

Preferably, the light-emitting and light-receiving devices are connected to a pair of optical fibers, respectively, which have end surfaces facing each other and oriented diagonally relative to a central vertical line therebetween.

Preferably, the second detector comprises an optical sensor for detecting relative positions between the arm and the holder in an ideal approach direction, in which the arm is moved forward to the holder.

Preferably, the second detector comprises a pair of optical sensors for detecting an orientation of the arm relative to the ideal approach direction, the pair of optical sensors are arranged to interpose a center line of the ideal approach direction.

Preferably, the signal processor derives the orientation of the arm from positions of opposite side edges of the arm detected by the pair of optical sensors.

According to a second aspect of the present invention, there is provided a vertical heat treatment system comprising:

(a) a heat treatment furnace for storing a plurality of target substrates, which belong to a group of substrates having substantially the same outline size, to subject the plurality of target substrates to heat treatment all together, the target substrates being supported on a plurality of holding places of a boat in a stacked state with gaps therebetween in the heat treatment furnace;

(b) a boat transport mechanism for transporting the boat together with the transfer substrates, between a position in the heat treatment furnace and a transfer station outside the heat treatment furnace;

(c) a transfer arm driven by a driving mechanism for transferring the target objects to and from the boat placed on the transfer station;

(d) a controller for controlling movement of the transfer arm by the driving mechanism in a driving coordinate system; and (e) the detecting apparatus for performing an auto-teaching operation to cause the controller to learn a unit of positional information in the coordinate system about the boat placed on the transfer station, wherein the holder of the first aspect corresponds to the boat.

According to a third aspect of the present invention, there is provided an auto-teaching method, in a semiconductor processing system, of causing a controller, for controlling movement of a transfer arm for a target substrate by a driving mechanism in a driving coordinate system, to learn a unit of positional information about a holder, to and from which the target substrate is transferred, in the coordinate system, the method comprising:

mounting a detecting apparatus on the holder, the detecting apparatus comprising first and second detectors attached to a base frame for detecting relative positions between the arm and the holder in vertical and horizontal directions, respectively, the first detector comprising a sensor of a reflection type for detecting presence of the arm at a position facing the first detector with a certain distance therebetween;

moving the arm under control of the controller, and detecting relative positions between the arm and the holder in a vertical direction by the first detector;

transmitting signals from the first detectors to the controller as electric detection signals;

deriving and storing, by the controller, a unit of positional information, comprising a position of the holder or a position of the arm representing the position of the holder in a vertical direction in the coordinate system, from signals denoting states of the driving mechanism corresponding to positions of the arm in the coordinate system, and detection signals of the first detector;

moving the arm under control of the controller, and detecting relative positions between the arm and the holder in a horizontal direction by the second detector;

transmitting signals from the second detectors to the controller as electric detection signals; and deriving and storing, by the controller, a unit of positional information, comprising a position of the holder or a position of the arm representing the position of the holder in a horizontal direction in the coordinate system, from signals denoting states of the driving mechanism corresponding to positions of the arm in the coordinate system, and detection signals of the second detector.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 10:
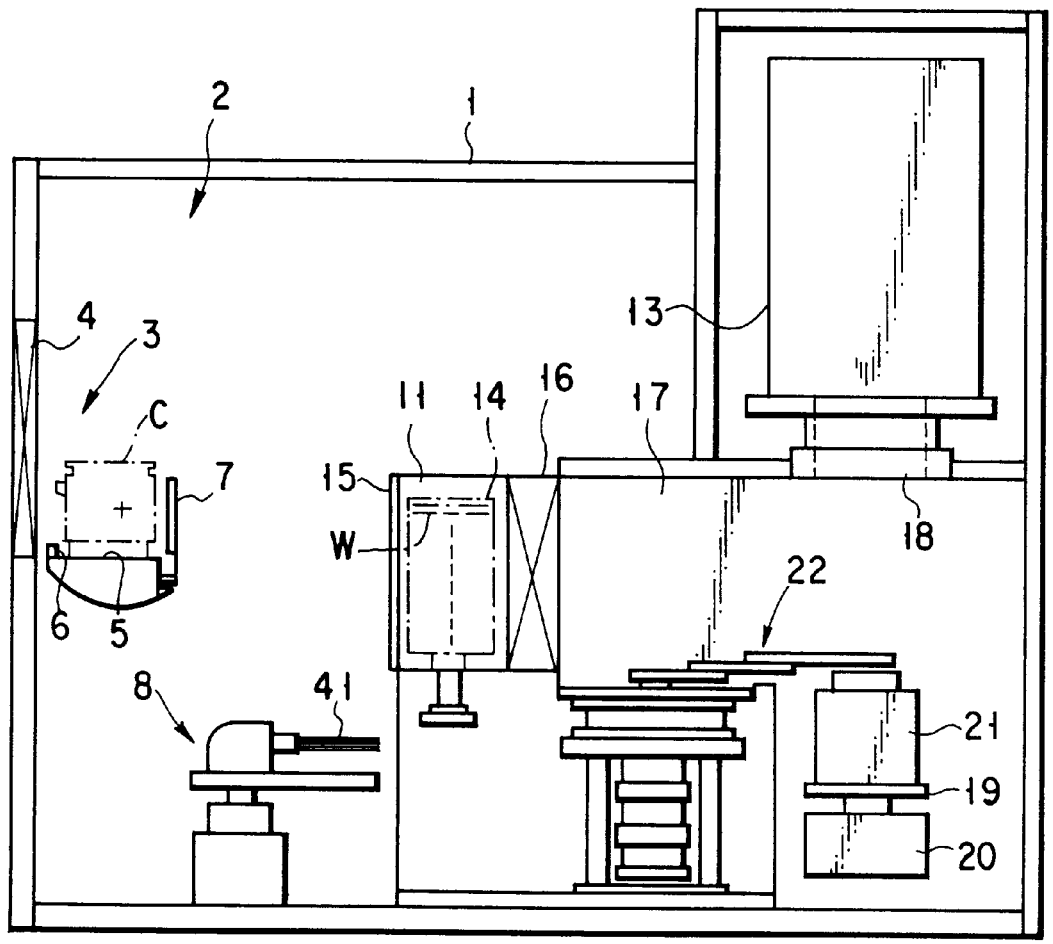
FIG. 10 is a view schematically showing the vertical heat treatment system according to an embodiment of the present invention, as a whole.

As shown in FIG. 10, an in/out section 3 is arranged in the front side of a casing 1 of a vertical heat treatment system, according to an embodiment of the present invention, to load/unload a transport container, e.g., a cassette C, for semiconductor wafers W as the target substrates in/from the system. The in/out section 3 has a loading/unloading port 4 having an opening/closing gate and arranged on the side wall of the casing 1, and a table 5 arranged near the loading/unloading port 4 to place the cassette C on it. The cassette C can store a plurality of, for example, about 25 wafers W having the same size, e.g., an 8-inch diameter, with a predetermined pitch in a vertically upright state.

Retaining portions 6 and 7 for retaining the cassette C from the front and rear, an orientation flat aligner (not shown) for aligning the orientation flat of the wafers W in the cassette C, and the like are arranged on the table 5. The table 5 is vertically and pivotally arranged, and can rotate the cassette C through about 90° to set the wafers W in the cassette C from the vertical state to the horizontal state.

Figure 1:
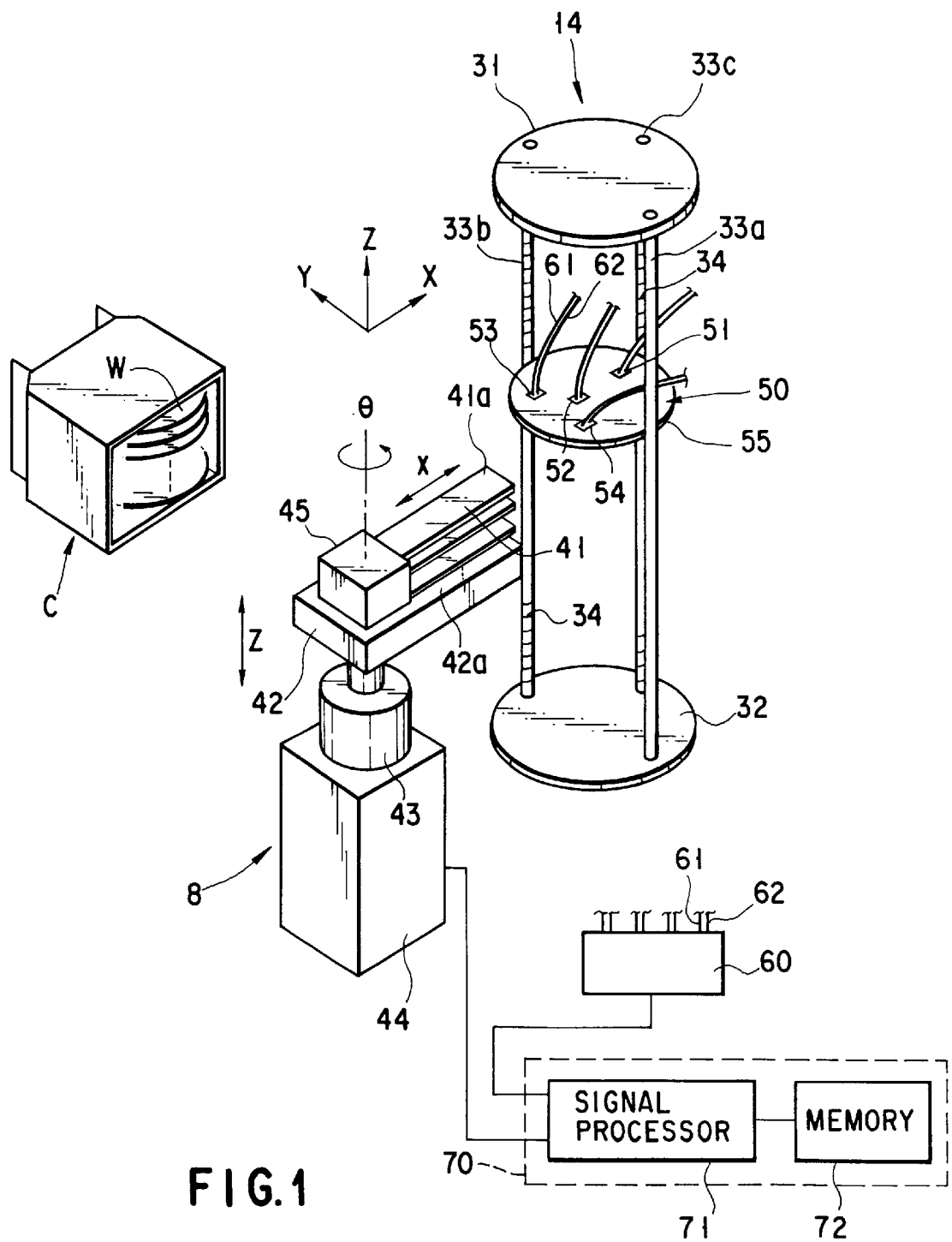
FIG. 1 is a perspective view showing a relationship among a wafer transfer apparatus, a wafer boat, a cassette, a detecting apparatus, and the like in a vertical heat treatment system shown in FIG. 10.

A transfer apparatus 8 having a plurality of, for example, five transfer arms 41 (some of them are shown in FIGS. 10 and 1), which are vertically movable and also capable of reciprocating and pivoting in a horizontal plane, are arranged in the casing 1. The table 5 described above, a cassette shelf (not shown) for storing and arranging the cassette C on it, and a first load-lock chamber 11 serving as a wafer transfer station surround the transfer apparatus 8 almost concentrically. Each of the wafer arms 41 has a support portion for transferring, for example, 8-inch wafers mounted thereon, one by one. With the wafer arms 41, the wafers are transferred between the cassette C on the cassette shelf and the boat 14 in the first load-lock chamber 11 serving as the wafer transfer station.

A space 2 in the casing 1 where the table 5, the transfer apparatus 8, the cassette shelf, and the like are present is connected to a vertical heat treatment furnace 13 through the first load-lock chamber 11 and a second load-lock chamber 17. The first load-lock chamber 11 serves as a pre-vacuum chamber and as a transfer station for loading/unloading wafers in/from a quartz boat 14 for heat treatment. The boat 14 can support a plurality of, for example, 150 wafers W having the same size, e.g., an 8-inch diameter, in a stacked state with gaps between them. The boat 14 is loaded in the vertical heat treatment furnace 13 and is heat-treated while it has a plurality of wafers W stacked on it.

The first load-lock chamber 11 is arranged at such a position that it opposes the table 5 with the transfer apparatus 8 therebetween. An opening having a load-lock door 15 is formed in the front side of the first load-lock chamber 11, which opposes the transfer apparatus 8. The second load-lock chamber 17 is continuously arranged behind the first load-lock chamber 11 through a gate valve 16.

The vertical heat treatment furnace 13 having a charging port (furnace port) 18 at its lower portion is located on the rear side of the casing 1. The second load-lock chamber 17 defines a loading area (operation area) under the heat treatment furnace 13. For example, the first and second load-lock chambers 11 and 17 can be evacuated to substantially the same vacuum degree as that for heat treatment of the heat treatment furnace 13, e.g., 1 Torr.

The first load-lock chamber 11 is set at the same pressure as that of the second load-lock chamber 17 before it is caused to communicate with the second load-lock chamber 17 by opening the gate valve 16. The first load-lock chamber 11 is also set at the pressure (atmospheric pressure) of the space 2 in the casing 1 before it is caused to communicate with the interior of the casing 1 by opening the load-lock door 15 of the first load-lock chamber 11 while the gate valve 16 is closed.

A lid 19 for opening/closing the charging port 18 of the heat treatment furnace 13 is arranged under the heat treatment furnace 13 such that it can be vertically moved by an elevating arm 20 of an elevating mechanism. The boat 14 is placed on the lid 19 through a quartz heat insulating cylinder 21. A transport mechanism 22 for transporting the boat 14 from the heat insulating cylinder 21 to the first load-lock chamber 11 or vice versa is arranged in the second load-lock chamber 17.

As shown in FIG. 1, the wafer boat 14 has top and bottom plates 31 and 32 arranged on the top and bottom sides, respectively, and facing each other. The top and bottom plates 31 and 32 are connected to each other by stays, such as three stays 33a to 33c, fixed thereto. Between the stays 33a and 33 is a transfer port for the wafer W, i.e., an entrance for the arms 41.

Each of the stays 33a to 33c are provided with 150 grooves 34 (some of them are shown in FIG. 1), to define 150 holding places or levels in the boat for holding 150 wafers W at a time. Each of the wafers is inserted in the grooves 34 of the stays 33a to 33c by its peripheral edge and horizontally held.

The wafer transfer apparatus 8 has X, θ, and Z drivers 42, 43, and 44 for driving the transfer arms 41 in X-, θ-, and Z-directions, respectively. The X-driver 42 reciprocates the arms 41, as described later, in the X-direction on a base 42a supporting the arms 41. The θ-driver 43 rotates the arms 41, along with the base 42a, in the θ-direction about a vertical axis. The Z-driver 44 moves the arms 41, along with the base 42a, in a vertical direction, i.e., the Z-direction. The drivers 42 to 44 are controlled by the controller 70, so that movement of the arms 41 is controlled in a driving coordinate system set in the controller 70.

The support portion 41a of each arm 41 is formed of a thin plate extending horizontally in the direction of reciprocal movement of the arm 41, and has a recessed portion (not shown) in its upper surface for placing a wafer W on it at a predetermined position. As a total of five arms 41 are used, five wafers W can be transferred simultaneously. The lowermost arm 41, for example, can reciprocally move independently of the other four arms 41. Hence, the wafers W can be transferred by the lowermost arm 41 one by one. The root portions of the other four arms 41 are integrated and are connected to a drive mechanism in the base 42a. The lowermost arm 41 is connected to another drive mechanism in the base 42a.

In FIG. 4, a detecting apparatus 50 for an auto-teaching operation is shown, where the apparatus 50 is mounted on the wafer boat 14. An auto-teaching operation is performed, for example, after the boat 14 is washed, to cause the controller 70 to specify and learn, in the driving coordinate system, the position of the boat 14 placed in the first load-lock chamber 11, i.e., the transfer station.

Figure 2:
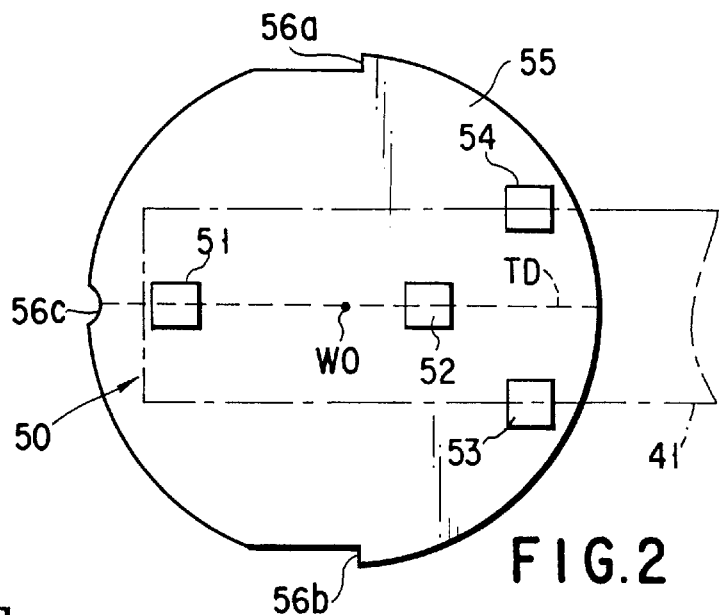
FIG. 2 is a plan view showing the base frame of the detecting apparatus shown in FIG. 1.

The detecting apparatus 50 has a base frame 55 detachably placed on one of the wafer holding places of the boat 14, i.e., one set of the grooves 34 of the stays 33a to 33c forming 150 levels. As shown in FIG. 2, the base frame 55 is formed of a circular plate having a diameter slightly larger than that of the wafer W. The base frame 55 is provided on its peripheral edge with two cut-outs 56a and 56b corresponding to the stays 33a and 33b and a dent 56c corresponding to the stay 33c. When substantially vertical side surfaces of the cut-outs 56a and 56b, and the dent 56c abut against substantially vertical side surfaces of the stays 33a to 33c, the base frame 55 is set in position on a holding place of the boat 14. In other words, the substantially vertical side surfaces of the cut-outs 56a and 56b, and the dent 56c function as positioning surfaces while the substantially vertical side surfaces of the stays 33a to 33c function as stopper surfaces.

Figure 3:
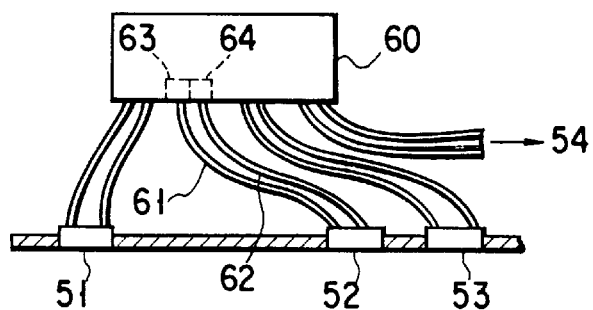
FIG. 3 is a cross-sectional view showing the base frame of the detecting apparatus shown in FIG. 1.
Figure 4A:
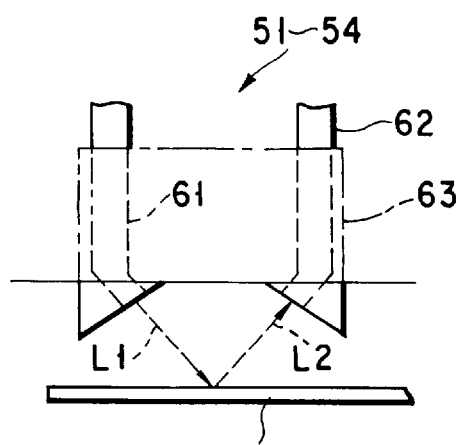
FIGS. 4A and 4B are a side view and a perspective view, respectively, showing one optical unit of the detecting apparatus shown in FIG. 1.
Figure 4B:
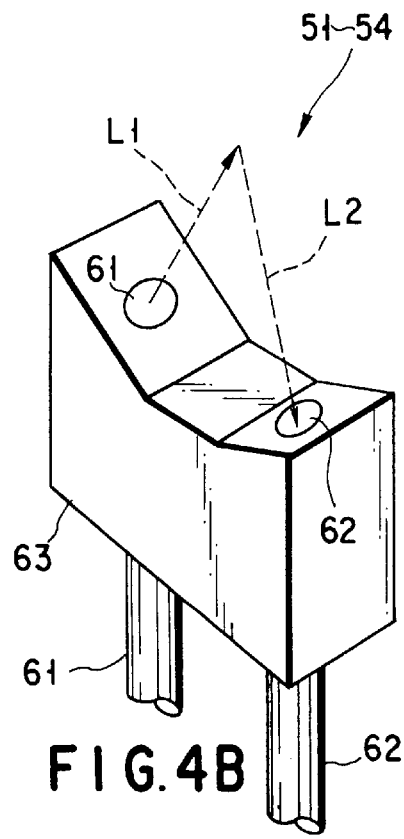
Figure 5:
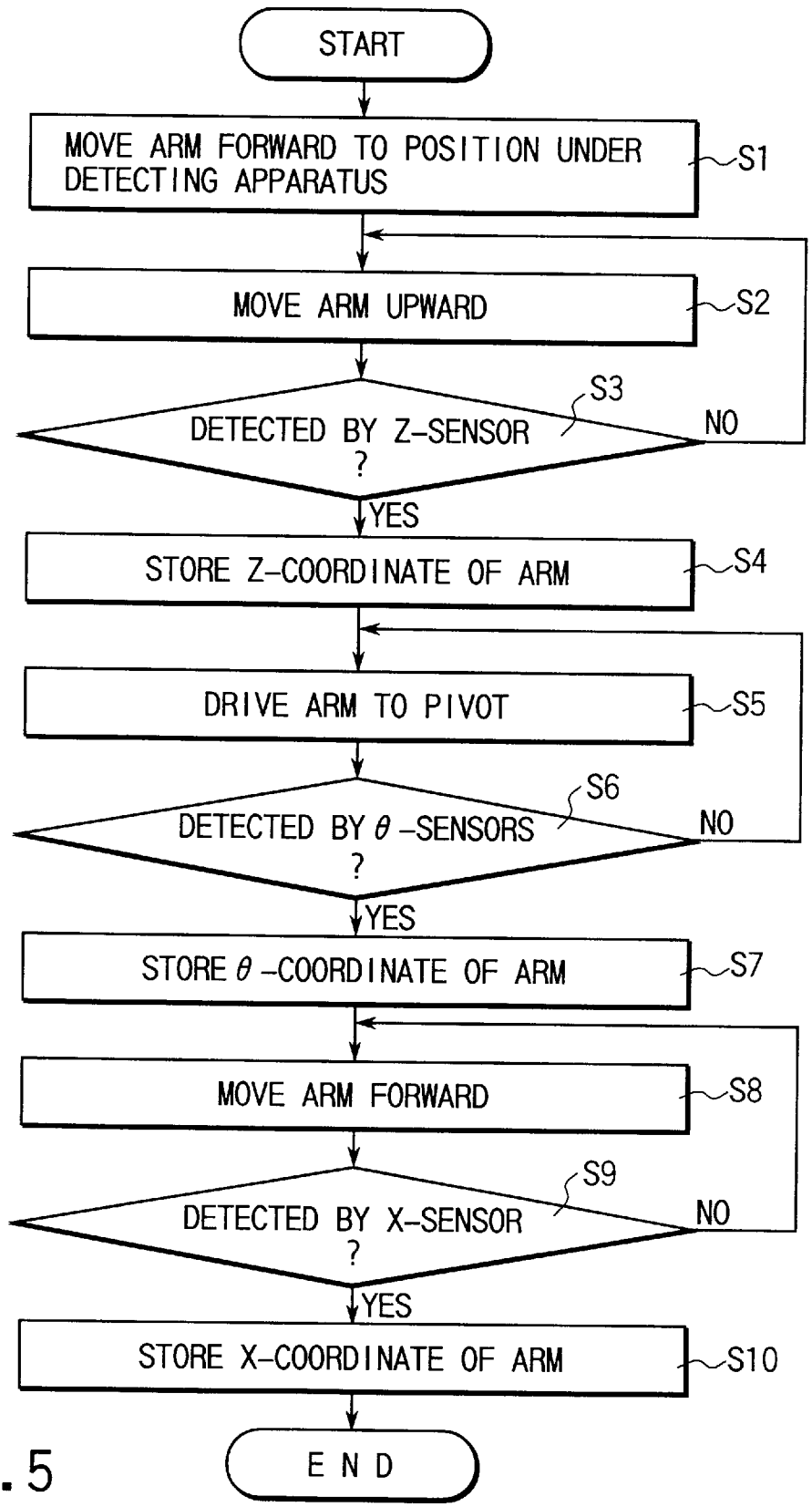
FIG. 5 is a flow chart showing an auto-teaching method according to an embodiment of the present invention.

As shown in FIGS. 2 and 3, a plurality of, for example, four optical units 51 to 54 are embedded on the bottom surface of the base frame 55 at predetermined positions. As shown in FIGS. 4A and 4B, each of the optical units 51 to 54 has a support body, in which distal ends of a light-emitting fiber 61 and a light-receiving fiber 62 are embedded. The proximal ends of the optical fibers 61 and 62 are connected to a light-emitting device 63 and a light-receiving device 64 (some of them are shown in FIG. 3), respectively, arranged in a photoelectric conversion unit 60. The light-emitting device 63 and the light-receiving device 64 are connected to the controller 70 through signal lines.

The distal end surfaces of the optical fibers 61 an 62 face each other and are oriented diagonally relative to a central vertical line therebetween. More specifically, the optical axes L1 and L2 of the optical fibers 61 and 62 are designed to intersect at a position 5 mm from the bottom surface of the base frame 55. When a reflection surface exists at the intersection point of the optical axes L1 and L2, a light beam from the light-emitting device 63 through the fiber 61 is reflected on the reflection surface, and reaches the light-receiving device 64 through the fiber 62. At this time, an electrical light-receiving signal, i.e., a detection signal is outputted from the photoelectric conversion unit 60 to the controller 70.

The transfer arms are made of ceramics and thus their surfaces form reflection surfaces. Accordingly, each of the optical unit 51 to 54 functions as a sensor of a reflection type for detecting whether an arm 41 exists at the intersection point of the optical axes L1 and L2 of the light-emitting and -receiving devices 63 and 64.

In this embodiment, the optical unit 51 is used as a sensor, which will be referred to as an X-sensor 51 hereinafter, for finding the position of the arm 41 in an X-direction. The distal edge of the arm 41 is observed by the X-sensor 51, so that the relative positions between the arm 41 and the boat 14 in an ideal approach direction on a horizontal plane can be detected. Ideally, the arm 41 horizontally enters the boat 14 in the ideal approach direction.

The optical unit 52 is used as a sensor, which will be referred to as a Z-sensor 51 hereinafter, for finding the position of the arm 41 in a Z-direction. The top surface of the arm 41 is observed by the Z-sensor 52, so that the relative positions between the arm 41 and the boat 14 in a vertical direction can be detected.

The optical units 53 and 54 are used as sensors, which will be referred to as θ-sensors 53 and 54 hereinafter, for finding the position of the arm 41 in a θ-direction. The opposite side edges of the arm 41 is observed by the Z-sensors 53 and 54, so that the orientation of the arm 41 on a horizontal plane can be detected relative to the ideal approach direction, in which the arm 41 enters the boat 14.

More specifically, the X-sensor 51 and the Z-sensor 52 are disposed on a center line TD (see FIG. 2) of the ideal approach direction, in which the arm 41 enters the boat 14, i.e., on a line perpendicular to a line connecting the stays 33a and 33b defining the entrance of the boat 14. The X-sensor 5.1 is disposed such that its detection point is located at a position 76 mm from the center WO of the wafer W mounted on one of the holding places, toward the stay 33c.

The θ-sensors 53 and 54 are disposed at positions shifted from the center WO toward the entrance. The θ-sensors 53 and 54 are symmetrically arranged on left and right sides interposing the center line TD, such that their detection points are located at slightly inner positions of the opposite side edges of the arm 41.

The controller 70 has a signal processor 71 and a memory 72. On the basis of detection signals from the Z-sensor 52, the θ-sensors 53 and 54, and the X-sensor 51, as well as positional signals of the arm 41 driven under control of the controller 70, a unit of positional information comprising the position of the boat 14 or the position of the arm 41 representing it in the driving coordinate system of the controller 70 is derived in the signal process 71, and the derived result is stored in the memory 72.

For example, when the signal processor 71 receives detection signals relative to the arm 41 from the Z-sensor 52, the θ-sensors 53 and 54, and the X-sensor 51, controlled states of the Z-driver 44, the θ-driver 43, and the X-driver 42 are stored in the memory as a unit of information corresponding to the position of the arm 41 at that time in the driving coordinate system of the controller 70. Since the positional relationship of the detection points of the Z-sensor 52, the θ-sensors 53 and 54, and the X-sensor 51 relative to a selected wafer holding place is preset, the positions of the wafer holding places of the boat 14 in the driving coordinate system of the controller 70 can be specified on the basis of the unit of positional information of the arm 41.

However, a unit of positional information needed by the controller 70 in order to control movement of the arm 41 relative to the boat 14 is a stop position at which the arm 41 is temporarily stopped above or below a selected holding place in a step of transferring the wafer W onto or from the holding place by the arm 41. Where the controller 70 once has a grasp on the stop position, the wafer W can be transferred onto or from the holding place simply by moving the arm 41 downward or upward therefrom by a predetermined amount. Accordingly, a unit of positional information about the wafer holding place of the boat 14 in the driving coordinate system is not necessarily the position of the holding place itself, but may be the position of the arm 41 representing the position of the holding place, such as an optimum stop position of the arm 41.

An explanation will be given on an auto-teaching method according to an embodiment of the present invention, with reference to FIGS. 5 to 8.

First, the detecting apparatus 50 is mounted on a selected wafer holding place of the boat 14. At this time, the base frame 55 is inserted in the grooves 34 of the stays 33a to 33c, and causes the side surfaces of the cut-outs 56a and 56b and the dent 56c to abut against the stays 33a to 33c, so that the base frame 55 is set in position on the holding place of the boat 14.

Figure 6:
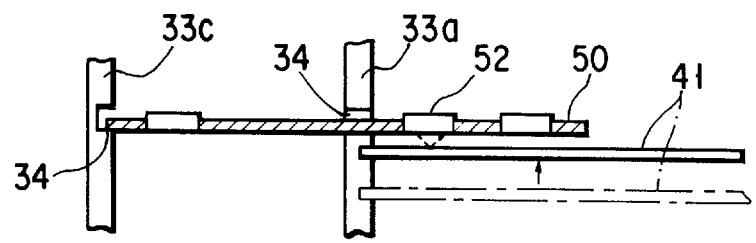
FIG. 6 is an explanatory view showing a step of the auto-teaching method shown in FIG. 5.

Subsequently, the lowermost arm 41 is moved forward to an appropriate position under the base frame 55 and distant therefrom by 5 mm or more (step S1). Then, as shown in FIG. 6, the arm 41 is moved upward by the Z-driver 44 (step S2), and it is confirmed whether a light-receiving signal is obtained in the Z-sensor 52 (step S3). When the light-receiving signal is not outputted from the Z-sensor 52, the arm 41 is further moved upward. In contrast, when the light-receiving signal is outputted from the Z-sensor 52, the Z-coordinate of the arm 41, i.e., the driven position of the Z-driver 44, at this time is read and stored in the memory 72 (step S4). Note that the driven position corresponds to, for example, the number of pulses generated in an encoder connected to a motor, with reference to an initial position.

Figure 7:
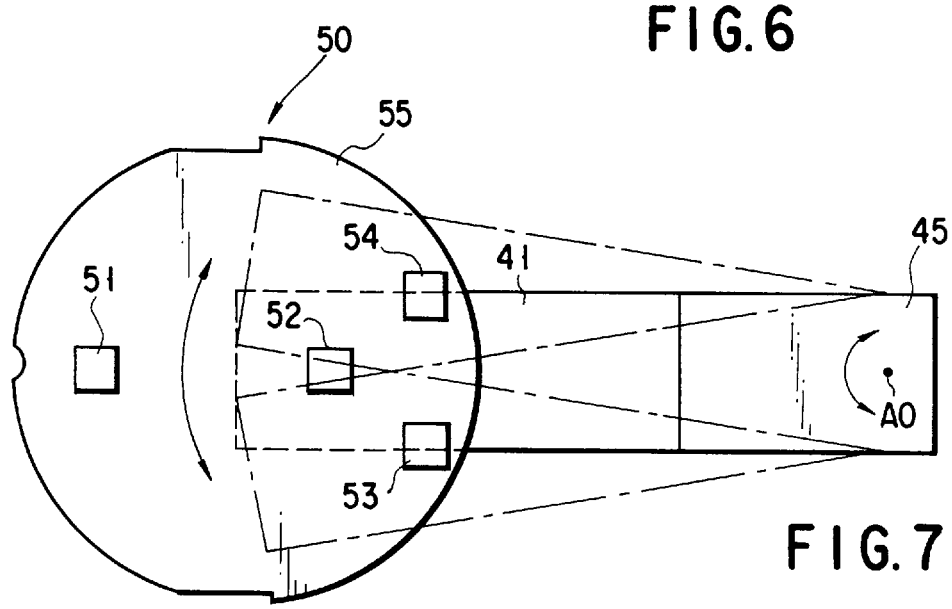
FIG. 7 is an explanatory view showing another step of the auto-teaching method shown in FIG. 5.

Then, as shown in FIG. 7, the arm 41 is driven to pivot about the axis AO by the θ-driver 43 (step S5), and it is confirmed whether light-receiving signals are obtained in the θ-sensors 53 and 54 (step S6). When the light-receiving signals are not outputted at the same time from the θ-sensors 53 and 54, the arm 41 is further driven to pivot. In contrast, when the light-receiving signals are outputted at the same time from the θ-sensors 53 and 54, the θ-coordinate of the arm 41, i.e., the driven position of the θ-driver 43, at this time is read and stored in the memory 72 (step S7). In other words, the θ-sensors 53 and 54 substantially utilize the positional relationship between the detection points and the opposite side edges of the arm 41 to detect the orientation of the arm 41. For example, when a light-receiving signal is outputted from the θ-sensor 53 but not from the θ-sensor 54, the arm 41 is driven to pivot toward the θ-sensor 54 since it has been shifted toward the θ-sensor 53.

Figure 8:
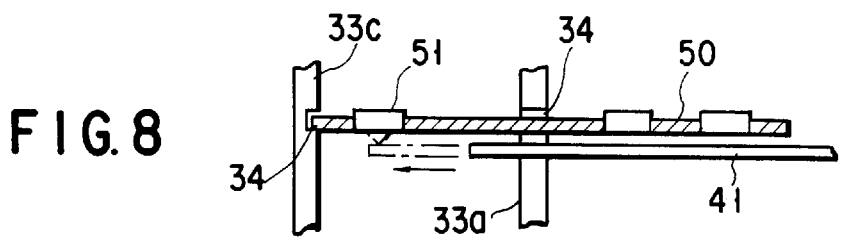
FIG. 8 is an explanatory view showing still another step of the auto-teaching method shown in FIG. 5.

Finally, as shown in FIG. 8, the arm 41 is moved forward by the X-driver 42 (step S8), and it is confirmed whether a light-receiving signal is obtained in the X-sensor 51 (step S9). When the light-receiving signal is not outputted from the X-sensor 51, the arm 41 is further moved forward. In contrast, when the light-receiving signal is outputted from the X-sensor 51, the X-coordinate of the arm 41, i.e., the driven position of the X-driver 42, at this time is read and stored in the memory 72 (step S10).

With the above described steps, the position of the arm 41 is stored as a unit of positional information representing the position of the wafer holding place of the boat 14 in the driving coordinate system. Particularly in this embodiment, a unit of positional information about the arm 41 in the θ- and X-directions can be used as an optimum stop position of the arm 41 when a wafer W is transferred onto each of the wafer holding places. Further, since the positional relationship of the detection points of the Z-sensor 52, the θ-sensors 53 and 54, and the X-sensor 51 relative to the wafer holding places is preset, the positions of the wafer holding places of the boat 14 in the driving coordinate system of the controller 70 can be specified on the basis of the unit of positional information of the arm 41.

Where the above described operation is performed in relation to two wafer holding places one on either the uppermost or lowermost side, the positions of the wafer holding places in the driving coordinate system can be obtained more accurately. For example, in the θ- and X-directions, units of positional information of the two wafer holding places on the uppermost and lowermost sides are averaged, and the average positional information thus obtained is used for all the wafer holding places. On the other hand, in the Z-direction, the vertical distance between the two wafer holding places on the uppermost and lowermost sides is divided by the number of the remaining grooves 34 on one stay, so that a unit of positional information is obtained about each of the wafer holding places. Instead, in the Z-direction, a unit of positional information about each of the wafer holding places can be obtained on the basis of the following formula: [the number of the grooves 34 on one stay]×[the pitch of the grooves 34 on one stay].

In an auto-teaching method according to the present invention, a manual operation by an operator with a visual assistance is necessary when the arm 41 is first moved forward to a position under the base frame 55. After the operation, however, the transfer apparatus 8 is operated on the basis of signals from the Z-sensor 52, the θ-sensors 53 and 54, and the X-sensor 51, so that the arm 41 is automatically controlled and moved.

The detecting apparatus 50 can be used for performing an auto-teaching operation, in terms of a transfer apparatus of any type for transferring a wafer by an arm 41. Since no sensors are attached to the transfer apparatus, the auto-teaching operation can be easily and inexpensively performed. Further, the detecting apparatus 50 can be used for a wafer transfer arm which is not driven in, for example, the θ-direction, but is driven only in X- Y-, and Z-directions.

Where the base frame 55 has a size basically the same as that of the wafer W, the detecting apparatus 50 can be used for wafer boats of various types. The base frame 55 does not have to have a shape the same as that of the wafer W, but at least a size to allow the base frame 55 to be mounted on the boat 14. An auto-teaching operation may be performed only for the Z-coordinate of the arm 41 by the Z-sensor 52 of a reflection type. An electrostatic capacitance sensor or an ultrasonic waver sensor may be used as the Z-sensor 52 of a reflection type, in place of an optical sensor.

Figure 9:
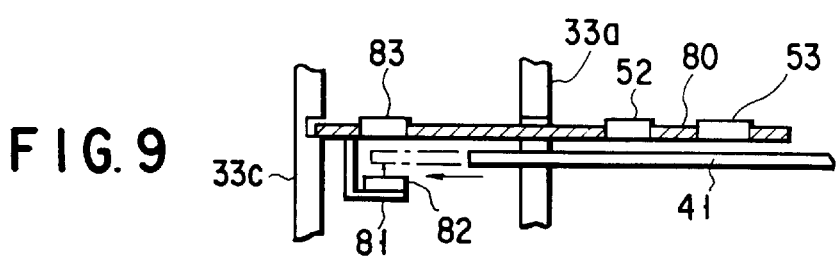
FIG. 9 is a cross-sectional view showing a modification of the X-sensor of the detecting apparatus shown in FIG. 1.

As the X-, Y, and θ-sensors, a sensor of a non-reflection type may be used. For example, in a modification shown in FIG. 9, a sensor of a transmission type, which is formed of a light-emitting device 82 and a light-receiving device 83 facing each other in a vertical direction, is arranged in place of the X-sensor 51. An L-shaped member 81 is arranged to have a vertical portion extending downward from the periphery of a base frame 80 and a horizontal portion extending inward. The light-emitting device 82 and a light-receiving device 83 are mounted on the top surface of the horizontal portion of the member 81 and the bottom surface of the base frame 80, respectively.

The present invention may be applied to a transfer apparatus for transferring a target substrate other than a semiconductor wafer, such as an LCD substrate. The present invention may also be applied to a transfer apparatus for transferring a target subject to and from a holder other than a wafer boat, such as a transfer container, e.g., a cassette, or a process worktable, e.g., a stage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A detecting apparatus for performing an auto-teaching operation in a semiconductor processing system to cause a controller, for controlling movement of a transfer arm for a target substrate by a driving mechanism in a driving coordinate system, to learn a unit of positional information about a holder, to and from which said target substrate is transferred, in said coordinate system, said detecting apparatus comprising:

a base frame designed to be detachably mounted on said holder;

a first detector attached to said base frame for detecting relative positions between said arm and said holder in a vertical direction, said first detector comprising a sensor of a reflection type for detecting presence of said arm at a position facing said first detector with a certain distance therebetween;

a second detector attached to said base frame for detecting relative positions between said arm and said holder in a horizontal direction;

a transmission member for transmitting signals from said first and second detectors to said controller as electric detection signals;

a signal processor arranged in said controller for deriving a unit of positional information, comprising a position of said holder or a position of said arm representing said position of said holder in said coordinate system, from signals denoting states of said driving mechanism corresponding to positions of said arm in said coordinate system, and detection signals of said first and second detectors; and a memory arranged in said controller for storing said unit of positional information derived by said signal processor.

2. The apparatus according to claim 1, wherein said holder has a holding place for holding said target substrate, and said base frame is designed to be detachably mounted on said holding place.

3. The apparatus according to claim 2, wherein said base frame is provided with a positioning surface extending in a direction intersecting a horizontal direction, for positioning said base frame on said holding place, and said positioning surface is arranged to abut against a stopper surface extending in a direction intersecting a horizontal direction on said holder.

4. The apparatus according to claim 3, wherein said base frame is formed of a flat plate, and said positioning surface is defined by a cut-out formed in said plate.

5. The apparatus according to claim 1, wherein said first detector comprises an optical sensor of a reflection type formed of a light-emitting device and a light-receiving device.

6. The apparatus according to claim 1, wherein said light-emitting and light-receiving devices are connected to a pair of optical fibers, respectively, which have end surfaces facing each other and oriented diagonally relative to a central vertical line therebetween.

7. The apparatus according to claim 1, wherein said second detector comprises an optical sensor for detecting relative positions between said arm and said holder in an ideal approach direction, in which said arm is moved forward to said holder.

8. The apparatus according to claim 7, wherein said second detector comprises a pair of optical sensors for detecting an orientation of said arm relative to said ideal approach direction, said pair of optical sensors are arranged to interpose a center line of said ideal approach direction.

9. The apparatus according to claim 8, wherein said signal processor derives said orientation of said arm from positions of opposite side edges of said arm detected by said pair of optical sensors.

10. A vertical heat treatment system comprising:
(a) a heat treatment furnace for storing a plurality of target substrates, which belong to a group of substrates having substantially the same outline size, to subject said plurality of target substrates to heat treatment all together, said target substrates being supported on a plurality of holding places of a boat in a stacked state with gaps therebetween in said heat treatment furnace;
(b) a boat transport mechanism for transporting said boat together with said transfer substrates, between a position in said heat treatment furnace and a transfer station outside said heat treatment furnace;
(c) a transfer arm driven by a driving mechanism for transferring said target objects to and from said boat placed on said transfer station;
(d) a controller for controlling movement of said transfer arm by said driving mechanism in a driving coordinate system; and
(e) a detecting apparatus for performing an auto-teaching operation to cause said controller to learn a unit of positional information in said coordinate system about said boat placed on said transfer station, said detecting apparatus comprising
a base frame designed to be detachably mounted on said boat,
a first detector attached to said base frame for detecting relative positions between said arm and said boat in a vertical direction, said first detector comprising a sensor of a reflection type for detecting presence of said arm at a position facing said first detector with a certain distance therebetween,
a second detector attached to said base frame for detecting relative positions between said arm and said boat in a horizontal direction,
a transmission member for transmitting signals from said first and second detectors to said controller as electric detection signals,
a signal processor arranged in said controller for deriving a unit of positional information, comprising a position of said boat or a position of said arm representing said position of said boat in said coordinate system, from signals denoting states of said driving mechanism corresponding to positions of said arm in said coordinate system, and detection signals of said first and second detectors, and
a memory arranged in said controller for storing said unit of positional information derived by said signal processor.

11. The system according to claim 10, wherein said base frame is designed to be detachably mounted on one of said holding places.

12. The system according to claim 11, wherein said base frame is provided with a positioning surface extending in a direction intersecting a horizontal direction, for positioning said base frame on one of said holding places, and said positioning surface is arranged to abut against a stopper surface extending in a direction intersecting a horizontal direction on said boat.

13. An auto-teaching method, in a semiconductor processing system, of causing a controller, for controlling movement of a transfer arm for a target substrate by a driving mechanism in a driving coordinate system, to learn a unit of positional information about a holder, to and from which said target substrate is transferred, in said coordinate system, said method comprising:
mounting a detecting apparatus on said holder, said detecting apparatus comprising first and second detectors attached to a base frame for detecting relative positions between said arm and said holder in vertical and horizontal directions, respectively, said first detector comprising a sensor of a reflection type for detecting presence of said arm at a position facing said first detector with a certain distance therebetween;
moving said arm under control of said controller, and detecting relative positions between said arm and said holder in a vertical direction by said first detector;
transmitting signals from said first detectors to said controller as electric detection signals;
deriving and storing, by said controller, a unit of positional information, comprising a position of said holder or a position of said arm representing said position of said holder in a vertical direction in said coordinate system, from signals denoting states of said driving mechanism corresponding to positions of said arm in said coordinate system, and detection signals of said first detector;
moving said arm under control of said controller, and detecting relative positions between said arm and said holder in a horizontal direction by said second detector;
transmitting signals from said second detectors to said controller as electric detection signals; and
deriving and storing, by said controller, a unit of positional information, comprising a position of said holder or a position of said arm representing said position of said holder in a horizontal direction in said coordinate system, from signals denoting states of said driving mechanism corresponding to positions of said arm in said coordinate system, and detection signals of said second detector.

14. The methods according to claim 13, comprising a step of mounting said base frame on a holding place of said holder for holding said target substrate.

15. The method according to claim 14, comprising a step of positioning said base frame on said holding place, wherein said base frame is provided with a positioning surface extending in a direction intersecting a horizontal direction, and said positioning surface is arranged to abut against a stopper surface extending in a direction intersecting a horizontal direction on said holder.

16. The method according to claim 13, wherein said step of detecting relative positions in said vertical direction is performed before said step of detecting relative positions in said horizontal direction.

17. The method according to claim 16, wherein said step of detecting relative positions in said horizontal direction comprises a step of detecting relative positions between said arm and said holder in an ideal approach direction, in which said arm is moved forward to said holder.

18. The method according to claim 17, wherein said step of detecting relative positions in said horizontal direction comprises a step of detecting an orientation of said arm relative to said ideal approach direction.

19. The method according to claim 18, wherein said step of detecting a orientation of said arm is performed before said step of detecting relative positions in said ideal approach direction.

20. The method according to claim 13, wherein said first and second detectors comprises optical sensors, respectively.

* * * * *